(12) United States Patent
Huang et al.

(10) Patent No.: US 6,693,365 B2
(45) Date of Patent: Feb. 17, 2004

(54) LOCAL ELECTROCHEMICAL DEPLATING OF ALIGNMENT MARK REGIONS OF SEMICONDUCTOR WAFERS

(75) Inventors: Chen-Ming Huang, Taipei (TW); Sen-Shan Yang, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 85 days.

(21) Appl. No.: 10/083,276

(22) Filed: Feb. 23, 2002

(65) Prior Publication Data

US 2003/0159935 A1 Aug. 28, 2003

(51) Int. Cl.[7] .................. H01L 23/544; H01L 21/76; H01L 21/301; H01L 21/302
(52) U.S. Cl. .................. 257/797; 257/797; 438/401; 438/462; 438/745
(58) Field of Search .................. 257/797; 438/401, 438/462; 205/771, 772

(56) References Cited

U.S. PATENT DOCUMENTS 4,632,724 A * 12/1986 Chesebro et al. .............. 438/8
6,056,869 A * 5/2000 Uzoh .......................... 205/771
2002/0153246 A1 * 10/2002 Wang ...................... 204/297.01
2002/0155661 A1 * 10/2002 Massingill et al. ......... 438/244

* cited by examiner

Primary Examiner—Carl Whitehead, Jr.
Assistant Examiner—David L. Hogans
(74) Attorney, Agent, or Firm—Tung & Associates

(57) ABSTRACT

Local electrochemical deplating of alignment mark regions of semiconductor wafers is disclosed. A tank holds an electrolytic solution. A primary cathode submersed within the solution is at least partially insulated therefrom. An electrochemically metal plated semiconductor wafer submersed within the solution acts as an anode, and has alignment mark regions. Extension cathodes submersed within the electrolytic solution are each at least partially insulated, except for a part of a first end and a second end thereof. The first end part is closely positioned over a corresponding alignment mark region, whereas the second end is situated on a corresponding exposed part of the primary cathode. A power source has its positive terminal operatively coupled to the primary cathode and its negative terminal operatively coupled to the wafer. Current from the power source electrochemically deplates the metal substantially from the alignment mark regions, substantially exposing the alignment marks within these regions.

8 Claims, 4 Drawing Sheets

US 6,693,365 B2

LOCAL ELECTROCHEMICAL DEPLATING OF ALIGNMENT MARK REGIONS OF SEMICONDUCTOR WAFERS

FIELD OF THE INVENTION

This invention relates generally to exposing alignment mark regions of semiconductor wafers after the wafers having been electrochemically metal plated, and more particularly to such exposure via local electrochemical deplating of the alignment mark regions.

BACKGROUND OF THE INVENTION

Alignment is critical in photolithography and deposition, as well as in other semiconductor processes. If layers are not deposited properly, or if they are not selectively removed properly, the resulting semiconductor devices may not function, relegating them to scrap, which can be costly. Therefore, alignment marks are placed on the semiconductor wafer for the proper positioning during the deposition and photolithography processes, among other processes. This is shown in FIG. 1, where the semiconductor wafer 102 has alignment marks 102 and 104 thereon. The semiconductor wafer 102 also has a number of dies, such as the die 108. Thus, when a mask is positioned over the wafer 202, its own alignment marks are aligned with the alignment marks 102 and 104 of the wafer 202.

As one example, alignment is especially critical where a number of metal or other layers have already been deposited on the wafer. Subsequent deposition of silicon dioxide or other layers in such instances usually requires that the alignment marks on the wafer be exposed for proper overlay of the silicon dioxide or other layers. While a mask may prevent the layers themselves from obfuscating the alignment marks, the photoresist used to pattern or perform other processing of these layers cannot be masked, and covers or at least blurs the alignment marks. Without clear exposure of the alignment marks, however, overlay misalignment can result. Overlay misalignment is also referred to as overlay registration error. Misalignment is a serious problem, and can result in significant semiconductor wafer scrap. Wafer scrap can sometimes be reused, but often is discarded, resulting in added costs incurred by the semiconductor foundry.

In some semiconductor fabrication processes, such as the copper damascene process known within the art, the semiconductor wafer is electrochemically plated with a metal, such as copper, tantalum nitride, both copper and tantalum nitride, and so on. This is shown in FIG. 2. The wafer 102 of FIG. 1 is indicated as the wafer 102', because it has been electrochemically metal plated, as indicated by the shading over its entire surface. The alignment marks 104 and 106 are obfuscated by the electrochemical metal plating, and should be exposed before further semiconductor fabrication processes that require alignment are performed on the wafer 102'.

Conventional alignment mark exposure processes, however, can also ruin a number of dies on the semiconductor wafer. FIG. 3 shows the results of exposing alignment marks after electrochemical metal plating, and optionally chemical mechanical polishing (CMP). The wafer 102' of FIG. 2 is indicated as the wafer 102" after exposure of the alignment marks. The alignment marks 104 and 106 are exposed by using an edge or bevel cleaner that removes the electrochemically plated metal from the wafer on a circular band 302 around the edge of the semiconductor wafer 102". Therefore, the semiconductor wafer 102" remains electrochemically plated everywhere on its surface except on the band 302.

As can be seen in FIG. 3, however, the exposure of alignment marks 104 and 106 by using an edge or bevel cleaner after electrochemical metal plating can also disadvantageously remove the electrochemical metal plating from some of the dies of the wafer 102", such as the die 108. These dies are shown in FIG. 3 as being only partially shaded, and thus being only partially covered by electrochemical metal plating. The edge or bevel cleaning process, in other words, while exposing the alignment marks 104 and 106, also undesirably removes some of the electrochemical metal plating of some of the dies, such as the die 108. This is disadvantageous, because it decreases die yield. The dies that have had some of their electrochemical metal plating removed are no longer usable, and must be discarded.

Therefore, there is a need to expose alignment marks after electrochemical metal plating that avoids these drawbacks. Specifically, there is a need to expose the alignment marks on a semiconductor wafer that has been electrochemically metal plated without affecting die yield. That is, there is a need to remove the electrochemical metal plating from the alignment marks, without also removing the electrochemical metal plating from one or more of the dies of the wafer. For these and other reasons, there is a need for the present invention.

SUMMARY OF THE INVENTION

The invention relates to local electrochemical deplating of alignment mark regions of semiconductor wafers. A tank holds an electrolytic solution. A primary cathode submersed within the solution is at least partially insulated therefrom. A semiconductor wafer submersed within the solution acts as an anode, and has one or more alignment mark regions. The semiconductor wafer has been electrochemically metal plated. Extension cathodes submersed within the electrolytic solution are each at least partially insulated, except for a part of a first end and a second end thereof. The first end part is closely positioned over a corresponding alignment mark region, whereas the second end is situated on a corresponding exposed part of the primary cathode. A power source has its positive terminal operatively coupled to the primary cathode and its negative terminal operatively coupled to the wafer. Current from the power source electrochemically deplates the metal substantially from the alignment mark regions, substantially exposing the alignment marks within these regions.

Embodiments of the invention provide for advantages over the prior art. The primary cathode and the extension cathodes are at least partially insulated from the electrolytic solution, except where one extension cathode end connects to the primary cathode and where the other extension cathode end is closely positioned over an alignment mark region. Therefore, electrochemical deplating substantially exposes only the alignment mark regions under the exposed ends of the extension cathodes. Little or no electrochemical deplating occurs on other parts of the semiconductor wafer, such as the dies of the wafer. Therefore, die yield does not decrease as a result of the alignment mark exposure process of the invention. Still other aspects, advantages, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
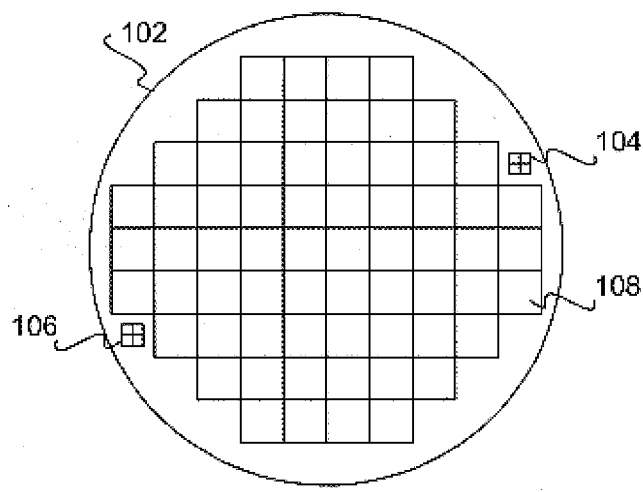
FIG. 1 is a diagram of a semiconductor wafer having a number of dies and two alignment marks, and in accordance with which embodiments of the invention can be practiced.
Figure 2:
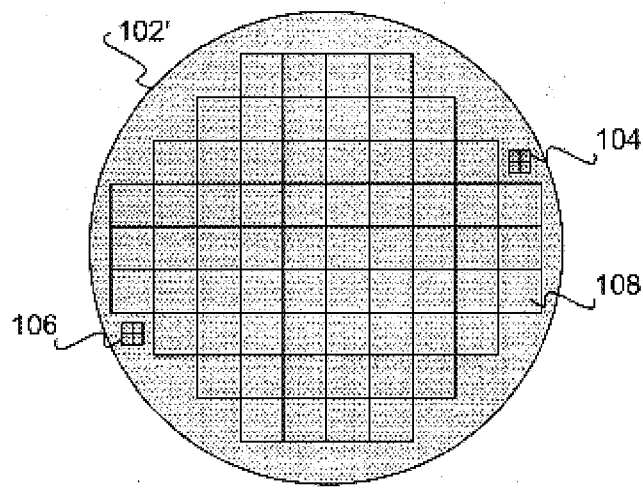
FIG. 2 is a diagram of the semiconductor wafer of FIG. 1 after it has been electrochemically metal plated over its entire surface, and in accordance with which embodiments of the invention can be practiced.
Figure 3:
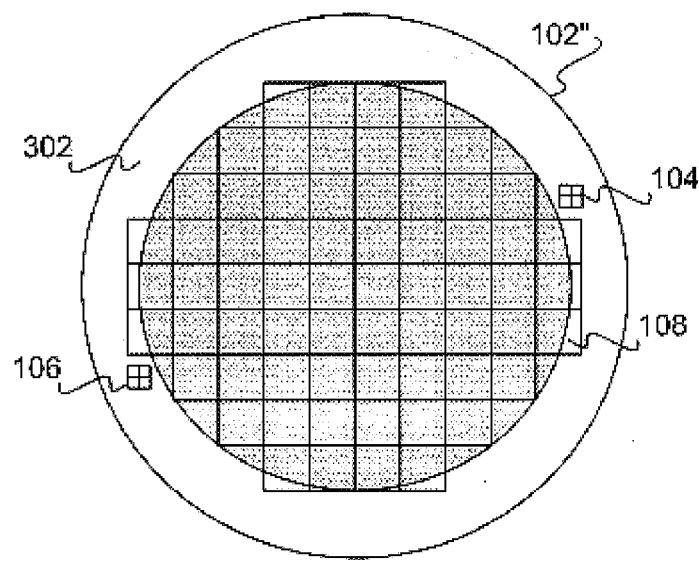
FIG. 3 is a diagram of the semiconductor wafer of FIG. 2 after its alignment marks have been exposed as a result of a bevel or edge cleaning process that also disadvantageously removes the electrochemical metal plating from a number of dies of the wafer, according to the prior art.
Figure 4:
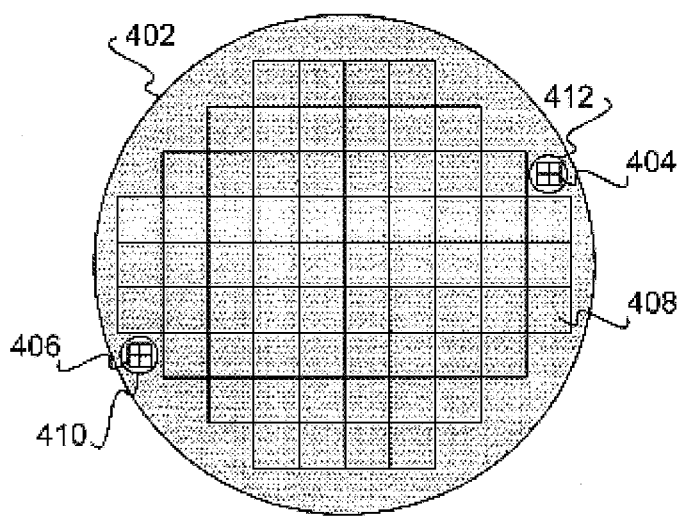
FIG. 4 is a diagram of a semiconductor wafer having a number of dies and two alignment marks, after the wafer has been entirely electrochemically metal plated and then after only alignment mark regions thereof have been exposed, according to an embodiment of the invention.

FIG. 4 shows a semiconductor wafer 402 after it has been electrochemically metal plated, and then locally electrochemically deplated according to an embodiment of the invention. The semiconductor wafer 402 includes alignment mark regions 412 and 410 that include alignment marks 404 and 406 respectively. There may be more or less alignment mark regions and/or alignment marks than is shown in FIG. 4, however. The wafer 402 also has a number of dies, such as the die 408. The shading of the wafer 402 indicates that the wafer has been electrochemically metal plated, such as with copper, tantalum nitride, both copper and tantalum nitride, and so on. After electrochemical deplating, substantially the only parts of the wafer 402 that have their electrochemical metal plating removed are the alignment mark regions 412 and 410 that include the alignment marks 404 and 406, respectively. Substantially all of the dies of the wafer 402, such as the die 408, have little or no of their electrochemical metal plating removed. Thus, die yield is not reduced significantly, if at all.

Figure 5:
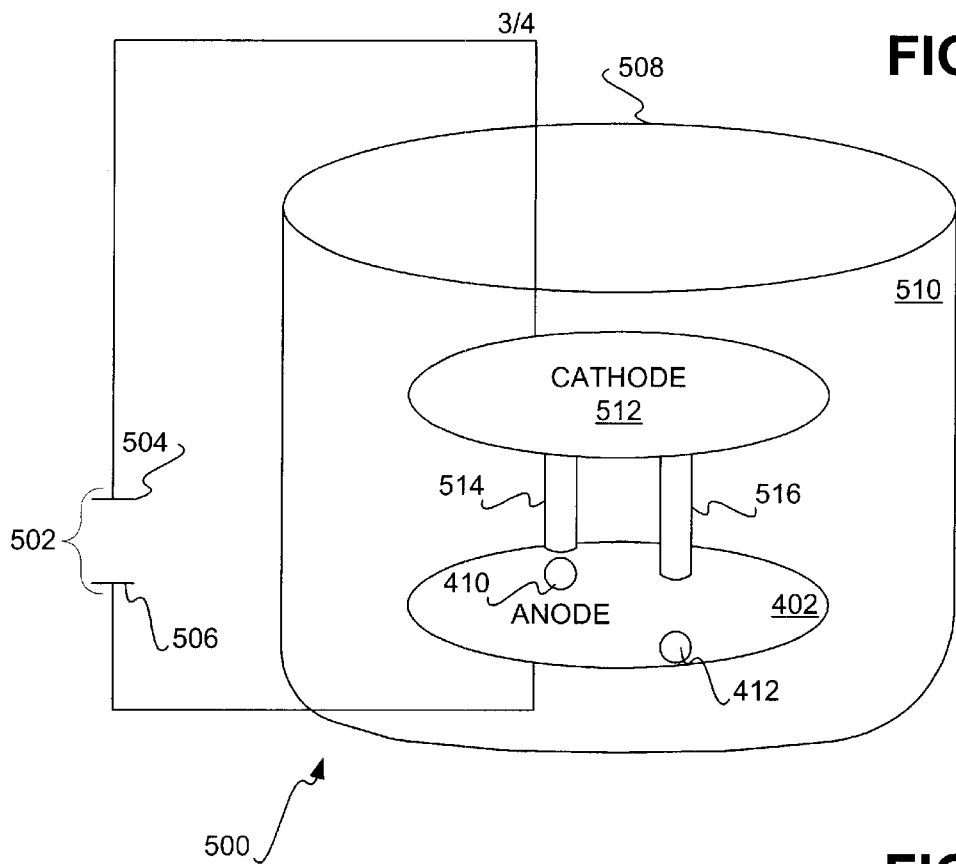
FIG. 5 is a diagram of system for electrochemically deplating only the alignment mark regions of a semiconductor wafer that has been previously electrochemically metal plated, such that substantially only the alignment mark regions are exposed, and little or no die yield decrease results, according to an embodiment of the invention. The system of FIG. 5 used on the wafer of FIG. 2 can result in the wafer of FIG. 4 in one embodiment of the invention.

FIG. 5 shows a system 500 according to an embodiment of the invention for locally electrochemically deplating only the alignment mark regions of a semiconductor wafer. A tank 508 holds an electrolytic solution 510, such as a copper electrolyte. Therein is submersed a primary cathode 512 from which two extension cathodes 514 and 516 extend, and the semiconductor wafer 402. The semiconductor wafer 402 serves or acts as an anode. The extension cathodes 514 and 516 are closely positioned over the alignment mark regions 410 and 412. The primary cathode 512 and the extension cathodes 514 and 516 are at least partially isolated. For instance, they may be substantially isolated except on the parts of the primary cathode 512 that remain exposed for the extension cathodes 514 and 516 to be situated or connected thereto, and except for the ends of the extension cathodes 514 and 516. The top ends of the extension cathodes 514 and 516 are exposed where they are situated or connected to the primary cathode 512. The bottom ends, or parts of the bottoms of the extension cathodes 514 and 516 including the bottom ends, are exposed.

A power source 502 includes a first terminal 504 and a second terminal 506. For local electrochemical deplating to occur, the first terminal 504 is negative, and the second terminal 506 is positive. The power source 502 is then turned on for a duration of time, such as one-half minute, so that local electrochemical deplating occurs substantially only at the alignment mark regions 410 and 412. This is why the only parts of the primary cathode 512 and the extension cathodes 514 and 516 that are not at least partially insulated after the latter have been situated on or connected to the former are the parts of the bottom ends or just the bottom ends of the extension cathodes 514 and 516. Thus, the electrochemical deplating process substantially occurs only at the bottom ends of the extension cathodes 514 and 516, which are closely positioned over the alignment regions 410 and 412, such as about 0.01 millimeters away. The only at least partial insulation of the other parts of the extension cathodes 514 and 516 and the primary cathode 512 promotes circulation of the electrolytic solution 510.

The same tank 508 can additionally be used for the initial electrochemical metal plating. For the electrochemical metal plating, preferably though not necessarily the extension cathodes 514 and 516 are removed, and the partial insulation of the cathodes 514 and 516 (if present) and the primary cathode 512 is also removed. The first terminal 504 becomes the positive terminal, connected to the cathode 512, and the second terminal 506 becomes the negative terminal, connected to the wafer 402. The power source 502 is turned on for a duration of time, so that the entire surface of the wafer 402 can be electrochemically metal plated.

Figure 6:
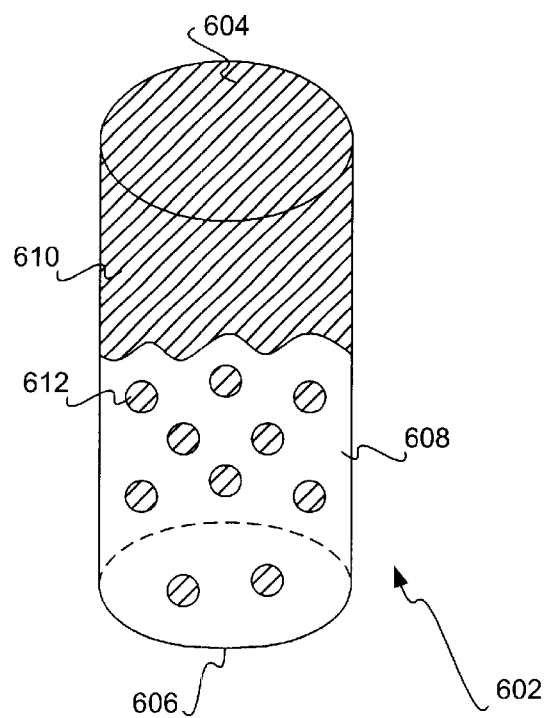
FIG. 6 is a diagram of an extension cathode, according to an embodiment of the invention, that can be used as one or both of the extension cathodes of FIG. 5 in one embodiment of the invention.

FIG. 6 shows in detail an extension cathode 602 according to an embodiment of the invention, and that can be used to implemented one or both of the extension cathodes 514 and 516 of FIG. 5. The extension cathode 602 as shown in FIG. 6 preferably has a cylindrical shape, although this is not necessary for implementation of the invention. The extension cathode 602 has a top end 604 and a bottom end 606. A bottom part of the extension cathode 602 is said to include part of the sidewall of the cathode 602 near and extending up from the bottom end 606, but may also alternatively include only the bottom end 606, and not any part of the sidewall.

The extension cathode 602 includes an electrode core 610, indicated in FIG. 6 via shading. The electrode core 610 may be platinum, for instance. The electrode core 610 is covered, except at the top end 604 and the bottom part including the bottom end 606, with a substantially insulated sleeve layer 608, indicating in FIG. 6 via no shading. However, as shown in FIG. 6, for illustrative clarity, the sleeve layer 608 has been removed on the top half of the sidewall of the electrode core 610. Those of ordinary skill within the art can appreciate, though, that it practice the sleeve layer 608 extends up to but not including the top end 604. Furthermore, the bottom part of the extension cathode 602 that is not covered by the sleeve layer 608 in FIG. 6 only includes the actual bottom end 606, and not any part of the sidewall extending up from the bottom end 606, as it can in another embodiment of the invention.

The sleeve layer 608 includes a number of holes, such as the hole 612, through which the electrode core 610 is exposed. When the extension cathode 602 is submersed in the electrolytic solution, these holes permit and promote circulation of the electrolytic solution to the electrode core 610. Thus, the sleeve layer 608 is said to be substantially insulated in that it is not totally insulated due to these holes. Furthermore, the extension cathode 602 is said to be at least partially insulated for two reasons. First, its top end 604 and its bottom part including at least the bottom end 606 are exposed, although the top end 604 is not exposed to the electrolytic solution due to its being connected to or situated on the primary cathode. The second reason is the holes of the sleeve layer 608.

Figure 7:
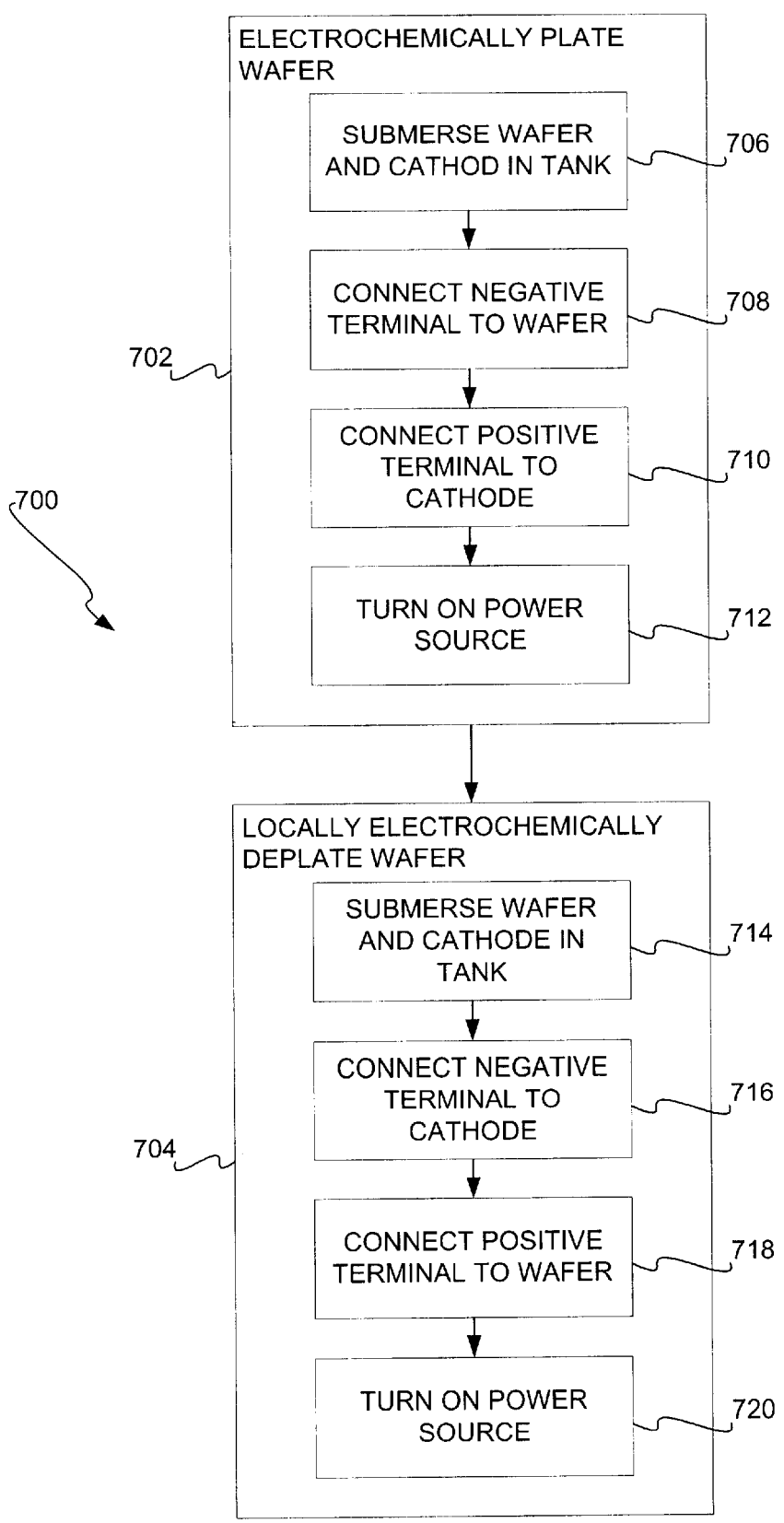
FIG. 7 is a flowchart of a method outlining an electrochemical metal plating process for coating a semiconductor wafer, and a local electrochemical deplating process for exposing substantially only alignment mark regions of the wafer, according to an embodiment of the invention.

FIG. 7 shows a method 700 according to an embodiment of the invention, which can be performed in conjunction with the embodiments of FIGS. 5 and 6 to yield the semiconductor wafer 402 of FIG. 4. The method 700 includes electrochemically plating a semiconductor wafer on its complete surface (702), and then locally electrochemically deplating the wafer on its alignment mark regions (704), to expose the alignment marks within those regions. The individual aspects of each of 702 and 704 are next described, with the understanding that 706 may be performed before, after or in-between 708 and 710, and that 714 may be performed before, after or in-between 716 and 718. Furthermore, 708 and 710 can be performed in any order, and 716 and 718 can be performed in any order.

With respect to the electrochemical plating, the wafer and a primary cathode, with or without extension cathode(s), are submersed in an electrolytic solution of a tank (706). Preferably the cathode is not at least partially insulated, although this is not necessary for implementation of the invention. A negative terminal of a power source is connected to the semiconductor wafer (708), whereas a positive terminal of the power source is connected to the cathode (710). The power source is then turned on for a duration of time (712), to electrochemically plate the surface of the wafer.

With respect to the local electrochemical deplating, the wafer and the primary cathode with extension cathode(s) are submersed in an electrolytic solution of a tank (714), which may be the same solution and tank as in 706. The cathode is partially insulated from the electrolytic solution except for an end of each extension cathode, where the end may include a part of the sidewall of the extension cathode. The extension cathodes are closely positioned over the alignment mark regions of the wafer. A negative terminal of a power source is connected to the cathode (716), whereas a positive terminal of the power source is connected to the wafer (718). The terminals and the power source may be the same as used in 708 and 710. Finally, the power source is turned on for a duration of time (720), to locally electrochemically deplate the wafer as to the alignment mark regions closely positioned under the extension cathodes.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A system comprising:

a tank holding an electrolytic solution;

a primary cathode submersed within the electrolytic solution in the tank, the primary cathode at least partially insulated from the electrolytic solution;

a semiconductor wafer submersed within electrolytic solution in the tank, the semiconductor wafer acting as an anode and having one or more alignment mark regions, the semiconductor wafer having been electrochemically plated with a metal;

one or more extension cathodes submersed within the electrolytic solution in the tank, each extension cathode at least partially insulated from the electrolytic solution except for a part of a first end and a second end thereof, the part of the first end closely positioned over a corresponding alignment mark region of the semiconductor wafer, the second end situated on a corresponding exposed part of the primary cathode; and, a power source having a negative terminal operatively coupled to the primary cathode and a positive terminal operatively coupled to the semiconductor wafer, such that current from the power source electrochemically deplates the metal substantially from the one or more alignment mark regions of the semiconductor wafer, substantially exposing one or more alignment marks within the one or more alignment mark regions.

2. The system of claim 1, wherein the electrolytic solution is a copper electrolytic solution.

3. The system of claim 1, wherein the primary cathode is encased in a substantially insulated sleeve having a plurality of holes therein to promote circulation of the electrolytic solution, except for the corresponding exposed part thereof on which each extension cathode is situated.

4. The system of claim 1, wherein the metal with which the semiconductor wafer has been electrochemically plated is at least one of: copper and tantalum nitride.

5. The system of claim 1, wherein the semiconductor wafer has been electrochemically plated in the tank via the negative terminal having been previously operatively coupled to the semiconductor wafer and the positive terminal having been previously operatively coupled to the primary cathode.

6. The system of claim 1, wherein each of the one or more extension cathodes comprises:

an electrode core; and, a substantially insulated sleeve layer covering the electrode core except for the part of the first end of the electrode core and the second end of the electrode code.

7. The system of claim 6, wherein the electrode core is a platinum core.

8. The system of claim 1, wherein each extension cathode is cylindrical in shape.

* * * * *